United States Patent [19]

Fraas

[11] 4,255,211
[45] Mar. 10, 1981

[54] MULTILAYER PHOTOVOLTAIC SOLAR CELL WITH SEMICONDUCTOR LAYER AT SHORTING JUNCTION INTERFACE

[75] Inventor: Lewis M. Fraas, Albany, Calif.

[73] Assignee: Chevron Research Company, San Francisco, Calif.

[21] Appl. No.: 108,767

[22] Filed: Dec. 31, 1979

[51] Int. Cl.³ .................................................. H01L 31/04
[52] U.S. Cl. ........................................ 136/249; 136/255; 136/262; 357/12; 357/30
[58] Field of Search ............ 136/89 MS, 89 SJ, 89 R, 136/89 GA; 357/30, 33, 12

[56] References Cited

U.S. PATENT DOCUMENTS

| | | | |
|---|---|---|---|
| 2,919,299 | 12/1959 | Paradise | 136/89 |
| 3,015,762 | 1/1962 | Shockley | 357/20 |
| 3,046,459 | 7/1962 | Anderson et al. | 357/12 |
| 3,186,873 | 6/1965 | Dunlap, Jr. | 136/89 |
| 4,015,280 | 3/1977 | Matsushita et al. | 357/30 |
| 4,017,332 | 4/1977 | James | 136/89 |
| 4,128,733 | 12/1978 | Fraas et al. | 136/89 SJ |
| 4,179,702 | 12/1979 | Lamorte | 357/30 |
| 4,191,593 | 3/1980 | Cacheux | 136/89 EA |

OTHER PUBLICATIONS

M. P. Vecchi, "Integrated Tandem Solar Cells", *Solar Energy*, vol. 22, pp. 383-388, (1979).
M. F. Lamorte et al., "Analysis of AlGaAs-GaInAs Cascade Solar Cell Under AMO-AM5 Spectra", *Solid State Electronics*, vol. 22, pp. 467-473, (1979).
A. B. Fowler, "Cumulative Photovoltaic Device", *IBM Tech. Disc. Bull.*, vol. 4, p. 61, (1962).

L. M. Fraas et al., "Design of High Efficiency Monolithic Stacked Multijunction Solar Cells", *Conf. Record, 13th IEEE Photovoltaic Specialists Conf.*, (1978), pp. 886-891.

*Primary Examiner*—Aaron Weisstuch
*Attorney, Agent, or Firm*—R. L. Freeland, Jr.; G. W. Wasson

[57] ABSTRACT

A new high efficiency, multijunction photovoltaic solar cell for use with a concentration lens. This cell comprises an elemental single crystal substrate without an internal light sensitive junction, upon which are two or more successive homogenous layers of semiconductor materials, each layer containing within it a light sensitive p/n junction of a similar polarity, each layer having essentially the same lattice constant as the single crystal substrate, each layer having a shorting junction contact with the layer immediately above and below it, each successive layer adsorbing light energy at a shorter wavelength, and each layer being of sufficient thickness and appropriate composition to develop essentially the same current as the other layers. At the junction, between the successive layers of the multilayer cell, a thin pseudo transparent low bandgap semiconductor layer is provided at the shorting junction interface. The outer surfaces of the top layer and the substrate are provided with electrical contacts for distribution of the electric current. The top contact comprises a layer of a transparent conductive material with electrical connections and the whole structure is completed with an antireflection coating over the top.

8 Claims, 3 Drawing Figures

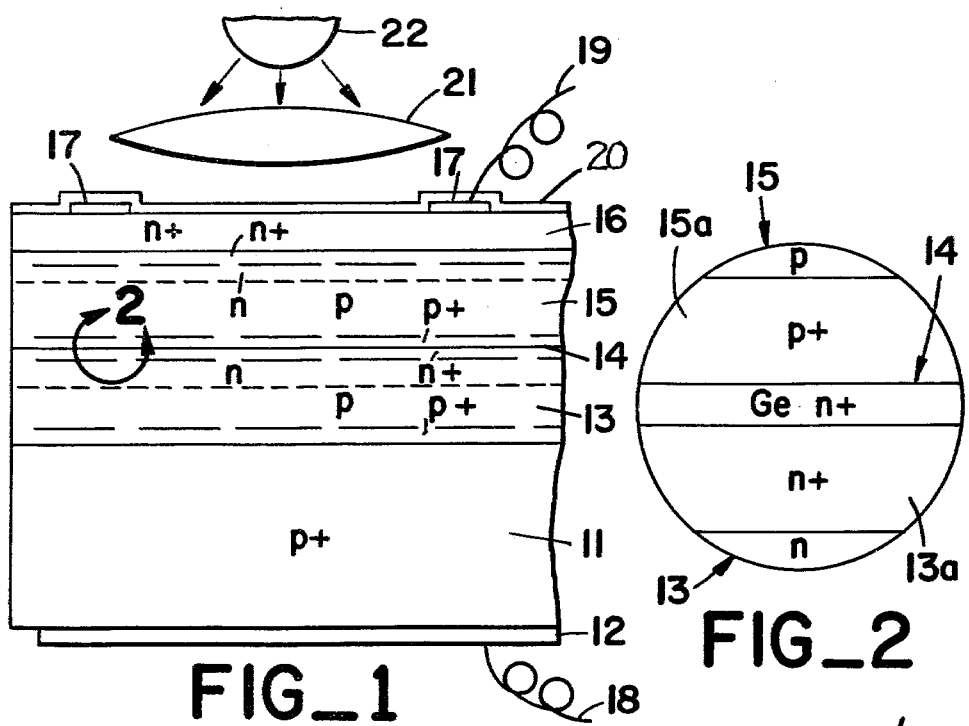
FIG_1
FIG_2
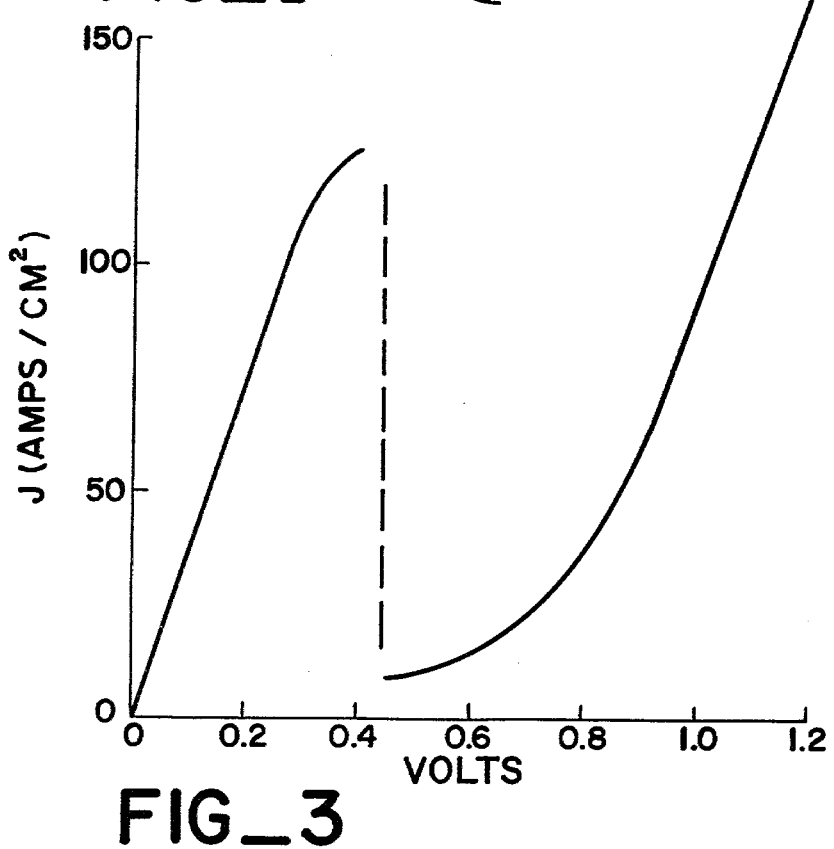
FIG_3

MULTILAYER PHOTOVOLTAIC SOLAR CELL WITH SEMICONDUCTOR LAYER AT SHORTING JUNCTION INTERFACE

FIELD OF THE INVENTION

This invention relates to the conversion of solar energy to electrical energy and particularly to a multilayer photovoltaic cell of high efficiency for such conversion.

BACKGROUND OF THE INVENTION

Several forms of photovoltaic cells have been developed for converting solar energy to electrical energy; however, the efficiency of known systems is low and, when efficiencies are improved through the use of more efficient converters, the cost of the converters is high. It has been proposed to decrease the conversion cost and to increase the conversion efficiency by concentrating the solar energy, through the use of optical systems, onto the converters. With such systems the efficiency of conversion can be further increased. Cost consideration on each of the several components of a conversion system indicates that, with light concentrators, more expensive photovoltaic converters may be employed; however, there are economic cost limits on the concentrator system. Further, as the concentration of light onto the converter becomes more intense, there is a need for dissipating the heat derived from the concentrated light because the efficiency of some converters drops as the heat of the converter increases.

From a study of the above recited considerations, it can be shown that, with the use of concentrator systems that can decrease the cost of energy conversion by increasing conversion efficiency, the emphasis can shift from converter cell cost to cell efficiency. Thus, if the cell efficiency can be made great enough, a concentrator system can produce electricity more cheaply than the same area of a lower cost array.

These observations lead to the consideration of high efficiency stacked multijunction solar cells with each cell responsive to a different energy band of solar energy and with a concentrator for concentrating the energy and tracking the cell toward the source of energy. However, a key requirement for the successful operation of a stacked multijunction solar cell is the requirement that the stacked junction be series-interconnected through low resistance interfaces thereby allowing the flow of light generated current from one junction to the next.

PRIOR ART

Multilayer photovoltaic cells have been suggested as a means for converting solar energy to electrical energy. One form for such a cell is described in my copending application Ser. No. 52,707 filed June 28, 1979 for "Multijunction Photovoltaic Solar Cell". The present application is directed to a multilayer photovoltaic cell composed of stacks of homojunction cells with a semiconductor layer at the interface of the shorting junction between layers of the cell.

The prior art multilayer photovoltaic cells have also suggested producing the successive layers of semiconductor materials responsive to different energy bandgaps. See L. W. James, U.S. Pat. No. 4,017,332, issued Apr. 12, 1977. In the cell disclosed in the present application several layers are selected to be responsive to different bandgaps, all at substantially the same current level, with a specific avoidance of the bandgap for light energy effected by fluctuations in humidity and air mass, and between the layers there is provided a thin low bandgap lattice-matched intermediate tunnel junction layer.

The photovoltaic cell disclosed in the present application is distinguished from the prior art disclosure by the specific absence of a junction in the substrate, by the further production of layers lattice matched to the substrate and containing homojunctions and further by the addition of a semiconductor layer at the interface of the shorting junction between layers of the cell to produce the desired electrical conversion with the desired efficiency.

BRIEF STATEMENT OF INVENTION

The idea of obtaining very high energy conversion efficiencies by optically stacking solar cells with different bandgaps is known. There is, however, increasing motivation to consider fabricating such a stack of solar cells monolithically on a single wafer. This follows for space applications because a single wafer is lighter than a multiple wafer stack, and for terrestrial applications using concentrator systems, because a single wafer is likely to be cheaper, simpler, and more easily cooled than is a multiple wafer stack. There are, however, major constraints on the design and fabrication of such a high efficiency monlithic stacked multijunction solar cell. Two design constraints are, first, that the different semiconductor materials making up the stack be nearly lattice matched so that crystal integrity can be maintained, and second, if the light sensitive junctions are to be series connected, that the material bandgaps be such that the light generated current be distributed approximately equally between the multiple junctions. A corollary problem is that of providing the desired series connection of the active junctions without suffering unacceptable voltage losses at inactive junctions, in the stacked structures to be considered.

In accordance with the foregoing, I propose a multijunction photovoltaic cell comprising layers of indium gallium phosphide and indium gallium arsenide on a germanium substrate. The successive layers include junctions in different absorption bands while the substrate and successive layers are lattice matched to less than $\pm 1\%$ variation. At the interface of the shorting junction between the layers I propose a thin transparent low bandgap semiconductor layer. With a concentrator, antireflective outer coatings, and top and bottom contacts the cell provides an efficient means for converting solar energy to electrical energy.

The photovoltaic cell disclosed herein is an improvement on the cell disclosed in my copending application Ser. No. 52,707, filed June 28, 1979 and the specification of that application is incorporated herein by reference.

The objects and features of the present invention will be readily apparent to those skilled in the art from the appended drawings and specification illustrated preferred embodiments wherein:

FIG. 1 is a two-junction cell in accordance with the present invention.

FIG. 2 is an enlarged cross-sectional view of the junction between layers of the cell of FIG. 1.

FIG. 3 is a plot of current vs. voltage for the interconnect region of FIG. 2 for the present invention.

The interconnecting shorting junction shown in FIG. 2 and characterized electrically in FIG. 3 can be described as a tunneling heterojunction. Specifically, the p+ GaInP to n+ Ge interface is a tunneling heterojunction.

In earlier described inventions, the tunneling junctions were either of a homojunction type with high bandgap materials (James, U.S. Pat. No. 4,017,332) or of a heterojunction type with a medium bandgap material (copending application Ser. No. 52,707).

The advantage of the tunneling heterojunction follows because, in tunneling, the current is controlled both by the energy barrier height and the barrier width. An increase in either the height or width leads to a reduction in tunneling current density. Thus, since the barrier is quite large in the prior art configuration, the width must be quite narrow. A small barrier width or depletion width requires an extremely high doping concentration, so high in fact that dopant precipitation can occur, thereby degrading crystallinity in the layer. A small barrier width also requires low interdiffusion and, therefore, low temperature processing. For the tunneling heterojunction structure, the barrier height is reduced, thereby allowing a larger barrier width.

In the invention disclosed herein I have proposed a further reduction in the barrier height by placing a thin semiconductor layer at the interface between layers of the photovoltaic cell. This reduction in barrier height permits a reduction in the shorting junction series resistance and thereby allows a multijunction cell to be operated with higher light intensities and therefore higher concentration ratios and potentially lower system cost. Furthermore, this reduction in barrier height permits a wider processing temperature range and a broader choice of dopants for the junction.

SPECIFIC TUNNEL JUNCTION CONFIGURATIONS

In my copending patent application, Ser. No. 52,707, I have noted that two- and three-color solar cells can be fabricated using InGaAsP alloy layers lattice-matched to a Ge substrate. A two-color solar cell of this type is shown in FIG. 1. For the FIG. 1 structure, the tunnel junction lies at the $Ga_{1-x}In_xAs/In_{1-y}Ga_yP$ interface. The barrier height of the interface is characterized by the bandgap of $Ga_{1-x}In_xAs$ of 1.2 ev. In the interface I now propose a semiconductor layer as shown in the enlargement of FIG. 2.

In proposing a tunneling heterojunction, I have noted that although the low band gap material will absorb light, that layer can be made thin enough so that little photogenerated current is lost. Specifically, for an absorption length of 5000 Å, a 500 Å thick layer will only absorb 10% of the light. If half the carriers generated drift in the wrong direction, 5% of the light generated current will be lost. This same pseudotransparency argument will apply to a lattice-matched semiconductor with an even smaller bandgap. For a multicolor cell on a germanium substrate, germanium is the obvious choice for a thin low bandgap lattice-matched intermediate tunnel junction layer. For this configuration, the barrier height for tunneling at the interface is characterized by the bandgap of Ge of 0.6 ev. I have found that n+ Ge forms an ohmic contact to n-type GaAs and that n+ Ge/p+GaAs tunnel junctions can be fabricated with current densities high enough for concentrator solar cells.

FIG. 3 shows a current (I) versus voltage (V) curve for a tunnel junction of the type I propose for the interface between the layers of the photovoltaic cell of my invention. A tunnel junction of the type to which FIG. 3 applies is described by J. C. Mariance in IBM Journal, 280 (1960).

DETAILED DESCRIPTION

FIGS. 1 and 2 represent a schematic cross-sectional representation of a multilayer photovoltaic solar cell of the present invention. The layers of the cell are not to scale either vertically or horizontally except that, in the vertical dimension, the layers are shown in somewhat relative thicknesses. As illustrated, a germanium substrate 11 is provided with a contact surface 12 at one side and is joined to a first semiconductor cell 13 at the other side. The cell 13 is preferably constructed of gallium, indium, and arsenic, having the composition of $Ga_{0.88}In_{0.12}As$ and an energy bandgap of 1.25 ev. A junction 14 is illustrated overlying the first layer 13. A second cell 15 is shown in contact with the first cell 13. The cell 15 is preferably constructed of gallium, indium, and phosphorous, having the composition of $Ga_{0.43}In_{0.57}P$ and an energy bandgap of 1.75 ev.

Deposited on the other surface of the second cell 15 is a conductive and transparent layer 16 of indium tin oxide or antimony tin oxide. The composition of indium tin oxide and antimony tin oxide are mixtures of two oxides; indium oxide ($In_2O_3$) and tin oxide ($SnO_2$) in the first composition and antimony oxide ($SbO_2$) and tin oxide in the second. These mixtures may be in any ratio of the two oxides, but in general there is from 80 to 90 mole percent indium oxide in the first composition and from 10 to 30 mole percent antimony oxide in the second composition. These compositions are conventionally indicated by the chemical formulae $In_2O_3/SnO_2$ or $SnO/SbO_2$.

One or more contacts 17 is attached to the outer surface of layer 16. Electrically conductive wires 18 and 19 are attached to the contacts 12 and 17, respectively. A transparent antireflective outer surface coating 29 is applied over the surface layer 16 and contacts 17.

As illustrated in FIG. 1, a concentrator 21, here shown as a concentrating lens, is positioned above the cell in a position to concentrate light from a source 22, here illustrated as the sun.

FIG. 2 is a section through the junction of the multilayer cell of FIG. 1, along lines 2—2, illustrating the particular feature of the present invention.

The section is enlarged to illustrate the junction as a thin semiconductor layer 14 of transparent low bandgap material, such as germanium. The semiconductor layer 14 separates the gallium indium arsenic layer 13 from the gallium indium phosphorous layer 15 and, in relative dimensions, is approximately 50 to 300 Å as compared to 500 Å for layer 13a and 1000 Å for layer 15a.

The particular quality of the germanium layer that permits it to function in the desired relationship is that, for the present invention, the layer is doped n+ while the layer 13a is doped n+ and layer 15a is doped p+.

A preferred method for constructing the multijunction solar cell of my invention is to start with a single crystal substrate, for example, a germanium wafer. The germanium wafer substrate does not include a light sensitive junction by preference; firstly, because a substrate with a junction becomes more costly to construct because the purity of the germanium wafer with a functional light sensitive junction is of the order of $\leq 1$ ppm whereas the wafer without a junction requires purity control of only $\leq 1000$ ppm; and secondly, because a junction in the germanium wafer would be responsive to the light wavelength range which is most severely effected by fluctuations in humidity and air mass. A further advantage of the germanium substrate is that it is an elemental semiconductor like silicon and it can be grown as a ribbon, thus contributing to its lower cost. Further, germanium is lattice matched to layers 13 and 15 above to <1% and should therefore permit the efficiency of the cell proposed herein to more nearly approach the theoretical limit. Further, the choice of a germanium substrate fixes the lattice constant of all the layers in the stack, including the low bandgap tunneling layer. Because of simplicity of deposition ($GeH_4$ pyrolysis), Ge is an ideal low bandgap material independent of substrate choice but a germanium substrate makes lattice matching automatic.

In the preferred form of the cell described herein the substrate germanium layer is between 200 and 300 micrometers thick and preferably 250 micrometers. The lower limit on thickness is determined both by operating conditions which establish the conduction characteristics of the substrate and the physical strength of the substrate in its function as the base of the multilayer cell. The upper limit for the dimension of the substrate is mainly economic in that thicker substrates are more costly to make and include more volume of an expensive material.

I propose a growth method which will allow in sequence III-V alloy layer depositions over large substrate areas. This type of deposition is known having been described in U.S. Pat. No. 4,128,733, issued Dec. 5, 1978 to L. M. Fraas et al. In copending application Ser. No. 52,707 I have shown a growth chamber for such a method, called low pressure metal organic chemical vapor deposition (MO-CVD). In this method, one introduces trialkyl gallium or trialkyl indium or a mixture thereof and phosphine or arsine or a mixture thereof into a pyrolysis chamber. These compounds react on the germanium substrate to form the required InGaAs or InGaP alloys. One example of the reaction is:

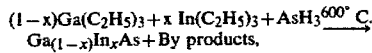

wherein x has a value in the range of >0 to <1. The product is a semiconductor film deposited on the germainum substrate.

The semiconductor is doped p-type by adding dialkyl zinc, dialkyl cadmium, or dialkyl beryllium trimethyl amine vapors and n-type by adding hydrogen sulfide, tetralkyl tin or dialkyl telluride vapors. All III-V alloy layers with the prescribed composition are grown in sequence by using a programmable gas flow controller.

In fabricating the multijunction solar cell of FIG. 1, I propose stacking lattice-matched homojunction cells together by placing shorting tunnel junctions at the heterofaces. Starting with a germanium substrate 11 with a dopant type p+, the next layer of the cell 13 is formed by the epitaxial deposition of a p+ type layer of gallium indium arsenide preferably with an alloy composition $Ga_{0.88}In_{0.12}As$. During the course of the deposition of this semiconductor layer, the concentration of the dopant is reduced to produce a p- type layer and eventually the dopant is changed to produce a p/n junction and transition to n- type layer. Continued deposition increases the thickness of the first layer and a finishing portion is deposited with a dopant concentration such as to produce an n+ layer at the boundary of the first cell.

As shown in the enlarged FIG. 2, a layer 14 of germanium with an n+ dopant is then deposited on the surface of the cell 13 to produce a tunnel junction between the layers of the multijunction cell. The germanium layer is epitaxially deposited on the surface of the cell 13 with the same metal organic chemical vapor deposition chamber via $GeH_4$ pyrolysis to a preferred thickness of between 50 and 300 Å.

A second semiconductor cell 15 is then epitaxially deposited on the outside surface of the Ge layer on the first cell initially with a dopant material and concentration to produce a p+ layer at the interface. The second semiconductor layer 15 is an indium gallium phosphide material with a preferred alloy composition of $In_{0.57}Ga_{0.43}P$. During the course of the deposition of this semiconductor layer, the concentration of the dopant is reduced to produce a p- type layer and eventually the dopant is changed to produce a p/n junction and transition to n- type layer. Continued deposition increases the thickness of the second layer with a transition of dopant composition such as to produce an n+ layer at the boundary of the second cell.

An outer conductive layer 16 is then deposited on the outer surface of the second cell 15 to complete the two-junction photovoltaic cell. The conductive layer may also be an antireflective coating or a separate coating 20 may be deposited on layer 16 and above conductor 17 in contact with layer 16. Preferably the conductive layer has an alloy composition of indium tin oxide ($In_2O_3/SnO_2$) conventionally abbreviated as ITO.

To complete the photovoltaic cell a pair of conductors 18 and 19 are attached one to each outer surface 12 of the substrate and the conductors 17 under layer 20.

It should be noted that the photovoltaically active junctions within the photovoltaic cell are homojunctions and that the stacked layers are lattice-matched. Further, there are germanium tunnel junctions at the heterofaces between the cells. With this method of construction more effective tunnel junctions are provided.

In the multilayer photovoltaic cell just described the first layer has a bandgap of 1.25 ev and the second layer has a bandgap of 1.75 ev. With an intermediate Ge layer aiding tunneling, the tunneling barrier height will be 0.6 ev.

In the preferred embodiment here described, the thickness of each deposited compound semiconductor layer is between 2 and 6 micrometers thick and preferably about 4 micrometers thick. The highly doped tunnel junction layer on the low bandgap side for the homojunction cell must be thin enough not to absorb an appreciable amount of light, i.e., <1000 Å. This criterion is not difficult to meet, since the absorption length is longer just above but near the band gap of a semiconductor, i.e., the region of interest for a multijunction cell. This layer must also be thick enough not to be completely depleted, i.e., >50 Å.

Each layer of the multilayer cell is lattice-matched to its neighbor layer with a maximum lattice constant variation of plus or minus 1.0%. This matching is important because with poor lattice matching or non-matching, crystallinity of the cell system degrades and a structure having a high density of crystal dislocations is formed, and in the worse cases, even grain boundaries are formed. Such dislocations then become sites for recombination of the light generated charge carriers, thus reducing the amount of current produced. These dislocations also provide shunting current paths which further reduce open circuit voltages.

Lattice-matching is accomplished by the proper choice of the composition and relative amounts of the materials in the different layers. The method of growth, with special control of the temperature is also important to the formation of high quality single crystal layers.

The layers of the preferred multilayer cell deposited on the germanium substrate are all lattice-matched to be germanium lattice constant of 5.66 Å to within ±1.0%.

The elements (except Ge) employed in the various layers of FIG. 1 and 2 are all found in columns IIIA and VA of the periodic table and are preferred for use according to the invention. However, other semiconductive materials can be used in accordance with the invention as defined by the appended claims and their legal equivalents. For example, compounds formed of elements in columns IIB and VIA such as CdS and CdTe could be used; also IB-IIIA-VIA compounds such as CuInS or variations thereof where, i.e., Se is substituted for S or Ga for In; also IIB-IVA-VA compounds such as ZnSnP. Also, other IIIA-VA compounds can be used in lieu of the most-preferred IIIA-VA compounds previously discussed.

While certain preferred embodiments of the invention have been specifically disclosed, it should be understood that the invention is not limited thereto as many variations will be readily apparent to those skilled in the art and the invention is to be given its broadest possible interpretation within the terms of the following claims.

What is claimed is:

1. A high efficiency, multi-junction photovoltaic solar cell for use with a light concentrating element, comprising a single crystal substrate without an internal light sensitive junction, two or more successive homogeneous layers of different semiconductor material deposited on said substrate, each layer containing within it a light sensitive p/n junction of a similar polarity, said p/n junction being a homojunction, each layer having essentially the same lattice constant as said single crystal substrate, each layer having a tunneling, shorting junction contact with the layer immediately above the below it, said shorting junction being a tunneling heterojunction, a thin substantially transparent low bandgap semiconductor layer at the inerface of said shorting junction, each layer being of sufficient thickness and appropriate composition to develop essentially the same zero voltage light generated current as the other layers, and each successive layer absorbing light energy at a different wavelength.

2. The photovoltaic solar cell of claim 1 wherein the semiconductor layer at the interface of said shorting junction is germanium.

3. The photovoltaic solar cell of claim 2 wherein the germanium layer is between 50 and 300 Å in thickness.

4. The photovoltaic solar cell of claim 2 wherein the germanium layer is approximately 100 Å in thickness.

5. The photovoltaic solar cell of claim 1 wherein the shorting junction consists of:
   (a) a heavily doped first layer of $Ga_{1-x}In_xAs$ of first conductivity type;
   (b) a heavily doped second layer of $In_{1-y}Ga_yP$ of opposite conductivity type, and
   (c) a heavily doped semiconductor layer of germanium at the interface of said first and second layers.

6. The photovoltaic solar cell of claim 5 wherein the first layer is about 500 Å thick, and the second layer is about 1000 Å thick, and the germanium layer is between 50 and 300 Å thick.

7. The photovoltaic solar cell of claim 1 wherein:
   (a) the substrate is germanium,
   (b) there are two successive homogeneous layers,
      (i) the first of said layers is $Ga_{1-x}In_xAs$
      (ii) the second of said layers is $In_{1-y}Ga_yP$
   (c) and the semiconductor layer at the interface of said shorting junction is germanium.

8. The photovoltaic solar cell of claim 6 wherein:
   (a) x equals 0.12 and
   (b) y equals 0.43.

* * * * *

UNITED STATES PATENT AND TRADEMARK OFFICE
CERTIFICATE OF CORRECTION

PATENT NO. : 4,255,211
DATED : December 31, 1979
INVENTOR(S) : Lewis M. Fraas

It is certified that error appears in the above-identified patent and that said Letters Patent are hereby corrected as shown below:

Abstract, Line 2, "concentration" should read --concentrating--.

Column 8, Line 1, "above the" should read --above and--.

Column 8, Line 4, "inerface" should read --interface--.

Column 8, Line 38, "claim 6" should read --claim 7--.

Signed and Sealed this

Twenty-ninth Day of September 1981

[SEAL]

*Attest:*

GERALD J. MOSSINGHOFF

*Attesting Officer*     *Commissioner of Patents and Trademarks*